United States Patent
Bosman et al.

(10) Patent No.: US 11,749,765 B2
(45) Date of Patent: Sep. 5, 2023

(54) METHOD OF MANUFACTURING A THIN-FILM PHOTOVOLTAIC PRODUCT

(71) Applicant: Nederlandse Organisatie voor toegepast-natuurwetenschappelijk onderzoek TNO, 's-Gravenhage (NL)

(72) Inventors: Johan Bosman, Wellerlooi (NL); Anne Ference Karel Victor Biezemans, Vlijmen (NL); Veronique Stephanie Gevaerts, Oisterwijk (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 45 days.

(21) Appl. No.: 17/625,564

(22) PCT Filed: Jul. 17, 2020

(86) PCT No.: PCT/NL2020/050473
§ 371 (c)(1),
(2) Date: Jan. 7, 2022

(87) PCT Pub. No.: WO2021/010837
PCT Pub. Date: Jan. 21, 2021

(65) Prior Publication Data
US 2022/0293805 A1    Sep. 15, 2022

(30) Foreign Application Priority Data
Jul. 18, 2019  (EP) ..................... 19187042

(51) Int. Cl.
*H01L 31/05*    (2014.01)
*H01L 31/0463*  (2014.01)
(Continued)

(52) U.S. Cl.
CPC ...... *H01L 31/0504* (2013.01); *H01L 31/0463* (2014.12); *H01L 31/0749* (2013.01); *H01L 31/18* (2013.01)

(58) Field of Classification Search
CPC ............. H01L 31/0463; H01L 31/0504; H01L 31/0749; H01L 31/18
See application file for complete search history.

(56) References Cited

U.S. PATENT DOCUMENTS 9,818,898 B2 * 11/2017 Karst .................. H01L 31/0463
2011/0030758 A1 * 2/2011 Kiriyama ............ H01L 31/0463
                                                    257/E21.531
(Continued)

FOREIGN PATENT DOCUMENTS

EP    3654389 A1 *  5/2020  ........... H01G 9/2081
EP    3764405 A1 *  1/2021  ......... H01L 31/0463
(Continued)

OTHER PUBLICATIONS

European Patent Office, International Search Report in corresponding International Application No. PCT/NL2020/050473, dated Sep. 7, 2020 (2 pages).

*Primary Examiner* — Golam Mowla
(74) *Attorney, Agent, or Firm* — Leydig, Voit & Mayer, Ltd.

(57) ABSTRACT

A method of manufacturing a photovoltaic product (1) with a plurality of serially interconnected photovoltaic cells (1A, 1B) is disclosed that comprises depositing a stack with a bottom electrode layer (12), a top electrode layer (16) and a photovoltaic layer (14) arranged between said first and said top electrode layer, the bottom electrode layer and the photovoltaic layer having an interface layer (13). The method further comprises partitioning said stack into respective lateral portions associated with respective photovoltaic cells (1A, 1B), with a boundary region (1AB) between each (Continued)

photovoltaic cell (1A) and a subsequent photovoltaic cell (1B), and serially interconnecting mutually subsequent photovoltaic cells in a boundary region. Partitioning includes forming one or more trenches (20; 22; 23) extending through the top electrode layer and the photovoltaic layer to expose the bottom electrode layer, with at least an irradiation sub-step and subsequent thereto a mechanical fragment removal sub-step.

20 Claims, 7 Drawing Sheets

(51) Int. Cl.
*H01L 31/0749* (2012.01)
*H01L 31/18* (2006.01)

(56) References Cited

U.S. PATENT DOCUMENTS

| | | |
|---|---|---|
| 2012/0000506 A1* | 1/2012 | Nam .................. H01L 31/0463 |
| | | 257/E31.124 |
| 2012/0094425 A1 | 4/2012 | Ghandour et al. |
| 2016/0126376 A1 | 5/2016 | Jeong et al. |
| 2019/0157480 A1* | 5/2019 | Bosman ............ H01L 31/03923 |
| 2019/0378945 A1* | 12/2019 | Allais .................. H01L 31/072 |

FOREIGN PATENT DOCUMENTS

| | | | | |
|---|---|---|---|---|
| EP | 3767686 A1 * | 1/2021 | ......... | H01L 31/0463 |
| JP | 2012/169569 A | 9/2012 | | |
| WO | WO-2012117182 A2 * | 9/2012 | ......... | H01L 31/0463 |
| WO | WO-2017188815 A1 * | 11/2017 | ..... | H01L 31/022466 |

* cited by examiner

METHOD OF MANUFACTURING A THIN-FILM PHOTOVOLTAIC PRODUCT

CROSS-REFERENCE TO RELATED APPLICATIONS

This patent application is a U.S. National Phase of PCT International Application No. PCT/NL2020/050473, filed Jul. 17, 2020, which claims priority to European Application No. 19187042.7, filed Jul. 18, 2019, which are both expressly incorporated by reference in their entireties, including any references contained therein.

The present disclosure pertains to a method of manufacturing a thin-film photovoltaic product.

A thin-film photovoltaic product typically comprises a stack with a bottom electrode layer, a photovoltaic layer and a top electrode layer. The stack may be deposited on a substrate, starting with the bottom electrode layer or the bottom electrode layer itself may serve as the substrate. The stack may include further layers, which are for example arranged between two of these subsequent layers or on top of or below the stack. A layer as referred to herein may comprise sublayers.

Thin-film photovoltaic products may be manufactured by subsequent deposition of the abovementioned layers on a substrate, or using for example the bottom electrode layer as a substrate. Typically the method includes further processing steps to provide the thin-film photovoltaic products with a plurality of serially interconnected photovoltaic cells. These further processing steps may include partitioning and interconnection steps. Partitioning may include formation of so called P1-, P2-, and P3-trenches which may take place in arbitrary order.

The P1-trenches are to partition at least the bottom electrode layer. The P2-trenches are primarily for exposing a section of the bottom electrode layer so as to provide access for an electrical connection from that section of the bottom electrode layer to a top electrode layer section of a neighboring photovoltaic cell. The P3-trenches are primarily for partitioning the top electrode layer. The P1-, P2- and P3-trenches alternate each other, so that a boundary region between mutually subsequent photovoltaic cells subsequently comprises a P1-trench, a P2-trench and a P3-trench.

Contrary to thin film silicon based photovoltaic materials, more recently investigated materials like CIGS and perovskites have a relatively high lateral conductivity. This necessitates that the partitioning of electrode also involves the partitioning of the photovoltaic layer, to avoid leakage currents. For an efficient manufacturing process it has been found advantageous to apply all partitioning steps after the deposition of the essential layers, bottom electrode layer, photovoltaic layer, top electrode layer, and optional intermediate layers of the stack is completed. The P1-trenches protrude completely through the stack. The P2-trenches as well as the P3-trenches protrude until the bottom electrode layer. It is noted that the P1-P2- and P3-trenches can be formed in any order as long as the specified patterning of the stack is achieved. In some embodiments a combination of trenches may result in a required partitioning. The P1-trench and optionally the P3-trenches are typically filled with an insulating material. Subsequently, each P1-trench is bridged by an electric connection extending from the bottom electrode layer of one photovoltaic cell exposed in a neighboring P2-trench to a top electrode layer of another photovoltaic cell neighboring the one photovoltaic cell at the P1-trench.

According to one approach, a needle is used to mechanically form one or more of the trenches in the layer stack. It is a disadvantage of this method that it is relatively inaccurate, and tends to disrupt the stack in the neighborhood of the layer, which requires an over-dimensioning of features in the neighborhood of the trench, such as a distance between the trench to be formed and a neighboring trench. Using a smaller needle enables a more accurate processing, but necessitates more frequent maintenance due to wear of the needle.

Alternatively, laser scribing may be used to form the trenches. Approaches are known, wherein the material at the locations of the trenches to be formed is caused to melt and evaporate by exposure with a laser beam. A substantial amount of heat is required to achieve this which easily tends to damage the photovoltaic material in the neighborhood of the trenches to be formed. Accordingly, there is a need for an improved method, that allows a more accurate processing causing less peripheral damage.

It is noted that US2012/0094425 discloses methods of laser scribing photovoltaic structures to form monolithically integrated photovoltaic modules. The methods involve forming P1, P2 or P3 scribes by an ablative scribing mechanism having low melting, and in certain embodiments, substantially no melting. In certain embodiments, the methods involve generating an ablation shockwave at an interface of the film to be removed and the underlying layer. The film is then removed by mechanical shock. According to various embodiments, the ablation shockwave is generated by using a laser beam having a wavelength providing an optical penetration depth on the order of the film thickness and a minimum threshold intensity. In some embodiments, photovoltaic materials can be scribed using picosecond pulse widths and certain wavelength and laser fluence levels.

It is further noted that US2016/0126376 discloses a method for manufacturing a thin film solar cell using a laser scribing method, wherein the effect of the laser irradiation is that the layer may be separated from an interface due to a focused stress by abrupt thermal expansion.

Another method of manufacturing a thin-film photovoltaic product is known from WO2013026463A1. It describes a scribing process for the removal of selected areas of a thin film from a substrate by means of irradiation with a pulsed laser in order to generate a time-varying thermal gradient, wherein the thermal gradient determines a temperature increase not inducing melting or sublimation, while inducing a thermal expansion producing an anisotropic mechanical strain which generates a time-varying detaching force at an interface layer between the thin film and the substrate capable of contrasting the adhesion force between the thin film and the substrate. The energy to which the semi-finished product is exposed with this method, although being lower than in methods relying on an evaporation of material, is still relatively high. The exposure tends to induce phase changes in the material of the photovoltaic layer at the edges of the trench. Such phase changes, which may occur even after a few tens of hours after the exposure, render the material conductive, and therewith form a shunt between the electrodes enclosing the photovoltaic layer. Accordingly, there is a need for a further reduction in energy required for partitioning. In particular a reduced heat exposure of material which is to remain at the boundary of the trenches is desired.

SUMMARY

According to the improved method in this disclosure, the step of partitioning the top electrode layer together with the photovoltaic layer and optional intermediate layer(s), such as an interface layer (if any) comprises an irradiation sub-step and subsequent thereto a mechanical fragment removal sub-step. In the irradiation sub-step an irradiation zone along a partitioning line is irradiated from a side facing the top electrode layer with a laser beam having a wavelength for which an interface layer between the bottom electrode layer and the photovoltaic layer has a relatively high absorption as compared to the photovoltaic layer and the top electrode layer. The radiation causes material from the interface layer to vaporize. The resulting vapor pressure induces a mechanical stress in the photovoltaic layer and the top electrode layer causing its fragmentation. The radiation energy is kept relatively low, so that the vapor can escape through pores between the fragments without substantially displacing the latter. A modest absorption of radiation in the photovoltaic layer is not problematic provided that melting or a change of phase thereof is avoided. The modest amount of heat induced in the photovoltaic layer can even contribute to heating the interface layer and therewith contribute to the fragmentation process. The irradiation sub-step therewith results in a fragmentation of the photovoltaic layer and of the top electrode layer within the irradiation zone. In the subsequent mechanical fragment removal sub-step, the fragments formed in the irradiation sub-step are removed.

The irradiation sub-step in the improved method merely needs to result in a fragmentation of the top electrode layer and the photovoltaic layer. Therewith the amount of energy to be supplied in the irradiation sub-step can be substantially lower than that what would be required for an immediate removal of material. Due to the fragmentation, the material of the top electrode layer and the photovoltaic layer can be removed mechanically from the irradiation zone with low effort and in a controlled manner, as compared to a removal by a direct ablation. The mechanical fragment removal sub-step can take place according to various options, e.g. using tacky rollers or tape, applying an air flow, using carbon dioxide snow and the like. With this hybrid procedure a vaporization of photovoltaic material is avoided. The resulting mechanical fragments are relatively large so that they can be filtered out of gaseous or liquid media relatively easily. A spreading of the mechanical fragments can even substantially be avoided by removal thereof with a tacky roller or tape.

As a result of the irradiation sub-step, material of the photovoltaic layer and of the top electrode layer is fragmented in a fragmentation zone subjected to the radiation. Irradiation may be performed for example with a Gaussian beam. Within the Rayleigh length of its focus, its spotsize can be approximated by $\sqrt{2}$ times the waist $\omega_0$ of the beam, which is defined as:

$$\omega_0 = 0.5 * Z_R * \Theta_{div}$$

Therein $Z_R$ is the Rayleigh length and $\Theta_{div}$ is the divergence of the beam.

For a circular symmetric Gaussian beam, the Rayleigh length is the distance between the position along the optical axis with the minimum wavefront radius to the position along the optical axis with the maximum of the wavefront radius, also denoted as focus point. The waist of the beam is considered the location where the intensity I of the beam is equal to $1/e^2$ the intensity $I_0$ in the center of the beam. In case the beam is not circular symmetric, the spotsize may be defined as $\sqrt{2}$ times the distance from the center of the beam to the location in a direction transverse to the direction of the trench to be formed where the intensity I of the beam is equal to $1/e^2$ the intensity $I_0$. The width of the fragmentation zone for example has a value in a range from 10 to 200 micron, e.g. in a range from 20 to 150 micron, e.g. about 100 micron, dependent on a desired width of the trench to be formed. Settings of the laser beam to achieve a particular width of the fragmentation zone can be determined with routine experiments. Therewith the fluency is to be set to a level that does not result in an immediate removal of material, but that sufficiently fragments the material within that zone for subsequent mechanical removal. If irradiation is performed with a Gaussian beam that impinges the surface within the Raleigh length of its focal point, then the width of the fragmentation zone substantially corresponds to the spotsize of that laser beam.

As noted above, the mechanical fragment removal sub-step can take place according to various options. According to an option, the fragments may be removed by adherence to a carrier, e.g. a tacky rollers or a tape, that is brought into contact with the surface of the semi-finished product. According to one option an air flow is used for removal of the fragmented material. This has the advantage that a physical contact with the semi-finished product is avoided in this stage. The fragments formed in the irradiation sub-step are relatively large, so that these can be easily removed by filtering the air flow.

The method is particularly suitable in the above-defined P3 partitioning step, as it results in partitioning of the photovoltaic layer and the top electrode layer with a low amount of energy, while removing substantially all fragmented material from the treated zone, therewith avoiding and electrical short. The method may alternatively or in addition be applied in the above-defined P2 partitioning step. The method is further particular suitable as a preparation for the above-defined P1 partitioning step. In that case, the step of forming a trench exposing the bottom electrode layer is succeeded by a further step which comprises an additional irradiation stage using a laser beam with a wavelength for which the bottom electrode layer has a relatively high absorption as compared to that of a substrate carrying the bottom electrode layer. Therewith material from the bottom electrode layer is ablated, and a trench protruding through the bottom electrode layer is formed. The laser beam in the additional irradiation stage should be applied with a spotsize that is sufficiently large to provide a trench between the bottom electrode layer portions that is sufficiently wide, e.g. at least 10 micron, to ensure a proper electrical insulation. The spotsize should however be smaller than that of the trench exposing the bottom electrode layer, for example half the width of that trench to avoid that a heating by the beam in the additional irradiation stage causes a release of additional material from the photovoltaic layer that could cause a shortcut between subsequent bottom electrode layer portions.

Various classes of photovoltaic materials are suitable for use in the photovoltaic or sub-layer thereof. Next to silicon based photovoltaic materials, perovskite materials are an important class of materials for use in a photovoltaic (sub-) layer, as these materials can be processed at relatively low temperatures, and yet have a conversion efficiency that comes close to that achieved with silicon based photovoltaic devices. In an embodiment the photo-electric conversion layer is provided of a perovskite material. Perovskite materials typical have a crystal structure of $ABX_3$, wherein A is an organic cation as methylammonium $(CH_3NH_3)^+$, B is an inorganic cation, usually lead (II) $(Pb_2^+)$, and X is a halogen atom such as iodine (I), chlorine (Cl) or bromine (Br). Perovskite materials are particularly advantageous in that they can be processed relatively easily and in that their bandgap can be set to a desired value by a proper choice of the halide content. A typical example is methylammonium lead trihalide ($CH_3NH_3PbX_3$), with an optical bandgap between 1.5 and 2.3 eV depending on halide content. Another more complex structure example is cesium-formamidinium lead trihalide ($Cs_{0.05}(H_2NCHNH_2)_{0.95}PbI_{2.85}Br_{0.15}$) having a bandgap between 1.5 and 2.2 eV. Other metals such as tin may replace the role of lead in perovskite materials. An example thereof is $CH_3NH_3SnI_3$. Also combinations of Sn with Pb perovskites having a wider bandgap in the range of 1.2 to 2.2 eV are possible. Also other materials are suitable, for example copper indium gallium (di) selenide (CIGS) or copper indium (di)selenide.

Best results are obtained in case the photovoltaic layer is provided with a relatively brittle material, such as CIGS, and has a thickness of at least 1000 nm.

DESCRIPTION OF THE DRAWINGS

These and other aspects of the disclosure are described in more detail with reference to the drawings. Therein.

DETAILED DESCRIPTION OF EMBODIMENTS

Figure 1:
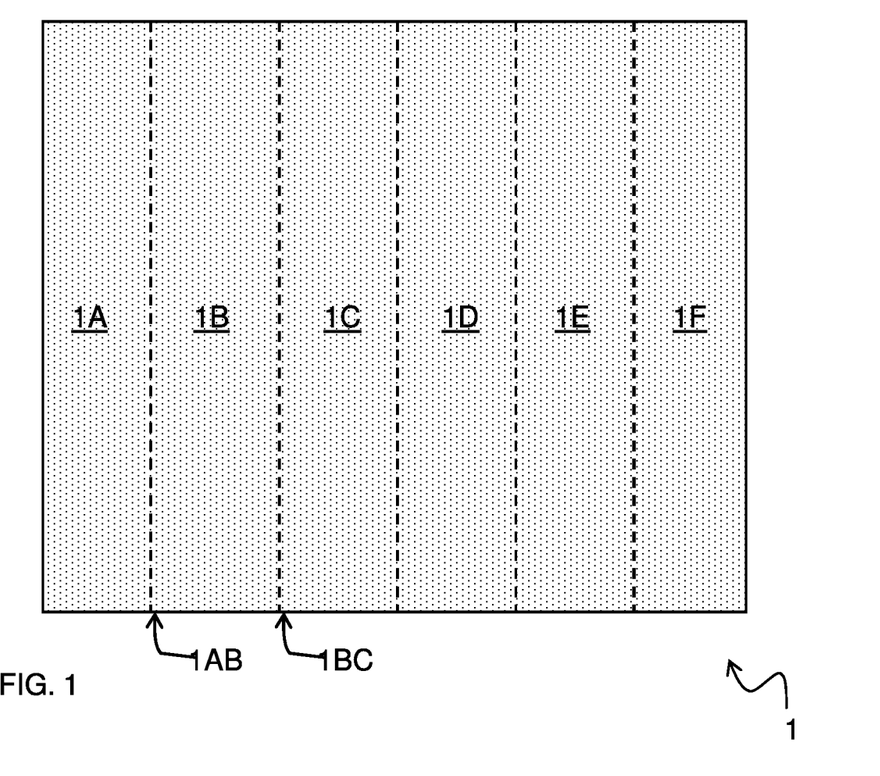
FIG. 1 schematically shows a thin-film photovoltaic product obtainable with a method as disclosed herein.

FIG. 1 schematically shows a thin-film photovoltaic product 1 with a plurality of photovoltaic cells 1A, . . . , 1F. The photovoltaic product 1 has a boundary region 1AB, 1BC etc between each pair of a photovoltaic cell and a subsequent photovoltaic cell. As shown in more detail in FIG. 5E and FIG. 6C, the photovoltaic product 1 comprises a stack with a bottom electrode layer 12, a top electrode layer 16, and an interface layer 13 and a photovoltaic layer 14 arranged between the first and the top electrode layer. Photovoltaic cells 1A, 1B, . . . , 1F are formed and pairs of a photovoltaic cell 1A and its successor 1B are serially connected in boundary region 1AB.

Figure 5A:
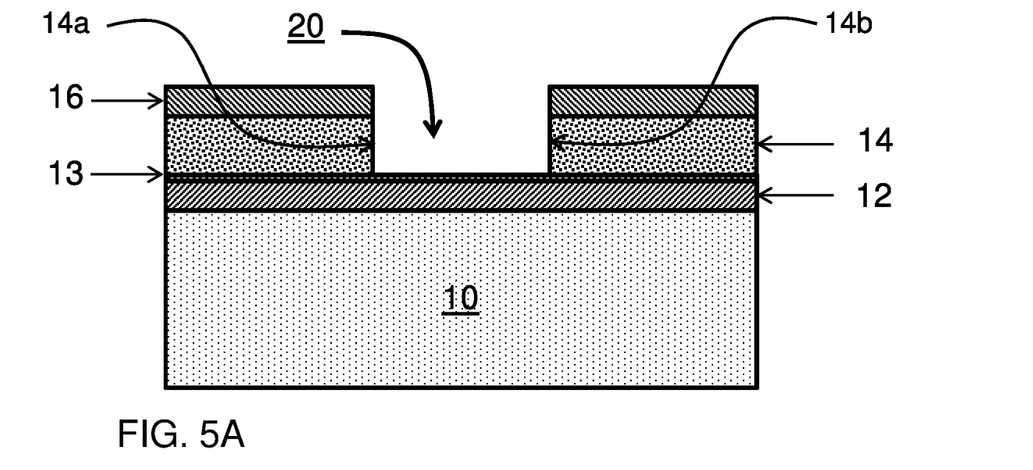
FIG. 5A is a cross-section according to VA-VA in FIG. 2.
Figure 5B:
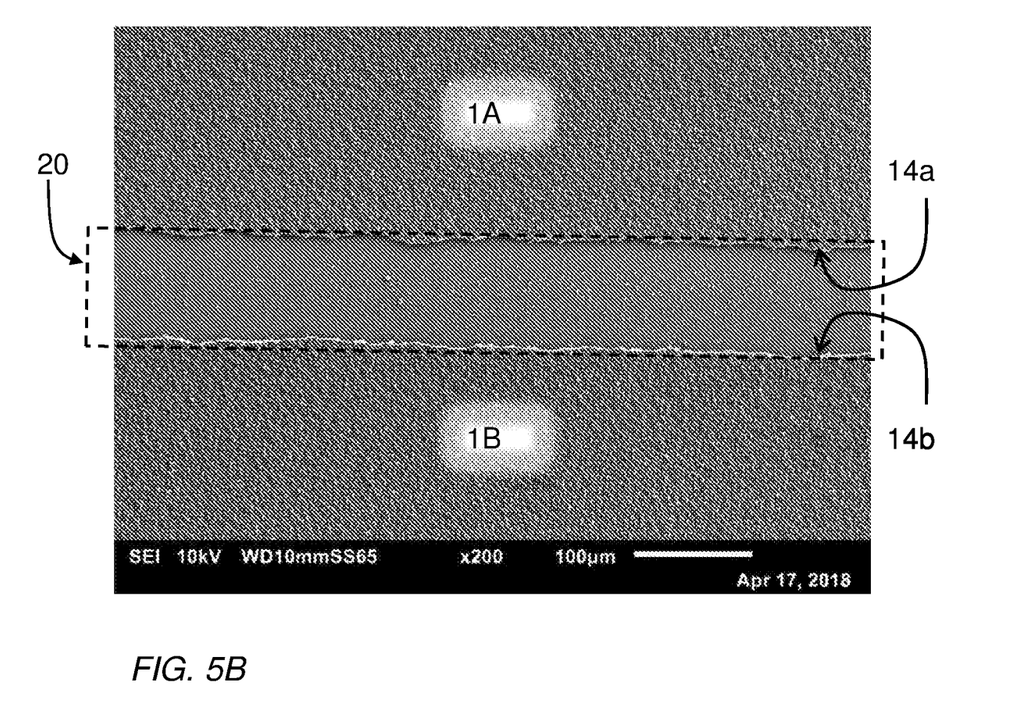
FIG. 5B is a picture of a sample which is taken according to a top-view as indicated by VB in FIG. 2.
Figure 5C:
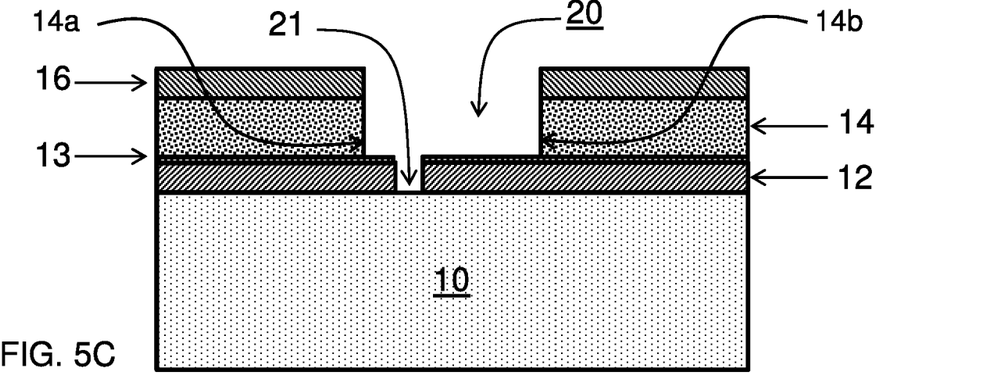
FIG. 5C-5E show further processing steps.
Figure 5D:
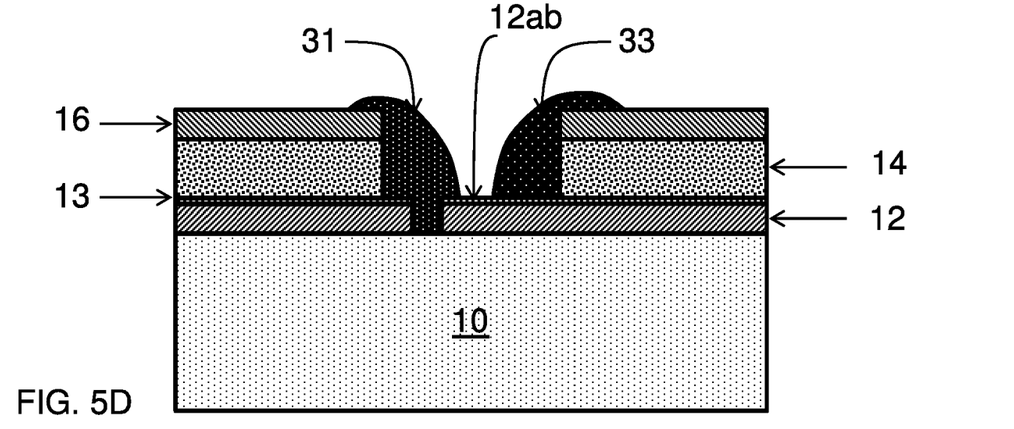
Figure 5E:
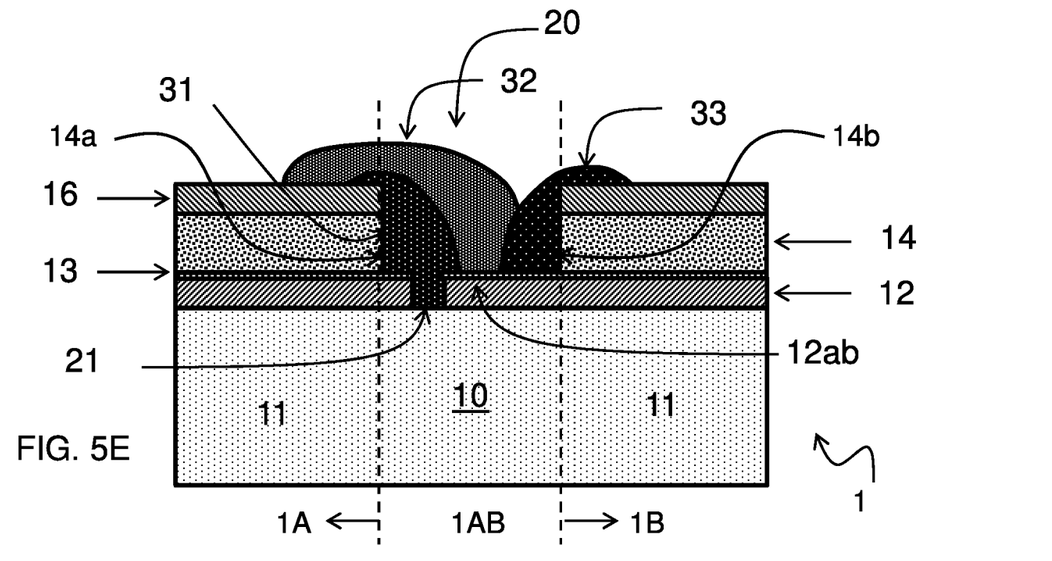

In the embodiment shown in FIG. 5E the boundary region 1AB is formed with a single trench 20 having a deepened portion 21 protruding through the bottom electrode layer 12, (See also FIG. 5C). In the embodiment of FIG. 5E, an insulating material 31, 33 is deposited at both sides of the single trench 20. The material 31 protrudes into the deepened portion 21 of the trench 20. An electrical connection 32 is provided that extends from an end portion of the top electrode layer 16 of the photovoltaic cell 1A to an portion of and end of the bottom electrode layer 12 of the succeeding photovoltaic cell 1B that is free from insulating material 31,33. The photovoltaic layer 14 has edges 14a, 14b at the single trench 20 (See FIG. 5C) that are free from re-solidified and phase changed photovoltaic material. Re-solidified and/or phase changed photovoltaic material would otherwise be present in case the single trench 20 was formed by irradiation at higher energy levels, aiming at a direct removal of the photovoltaic material. Furthermore, due to the fact that no needle was involved to form the trench 20, the remaining portions of the bottom electrode layer 12 at the bottom thereof are free from scratches. It is noted that in some cases a needle or other cleaning method may be used should it be desired to remove any remaining material from interface layer 13. As the photovoltaic layer 14 and the top electrode layer 16 were already removed using the herein disclosed hybrid procedure, this can be achieved with a modest effort, so that damage to the bottom electrode layer 12 is therewith avoided.

Figure 6A:
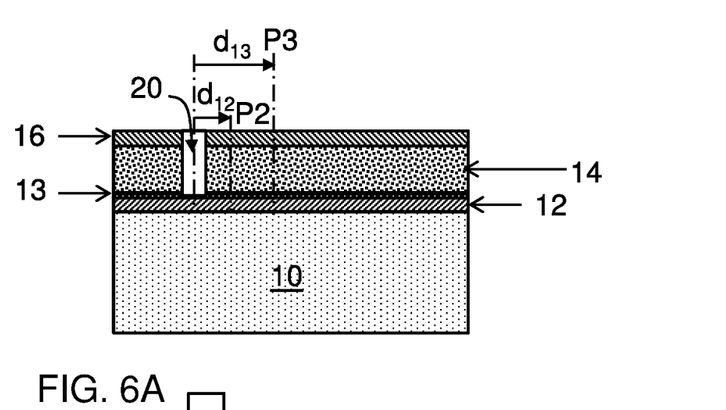
FIG. 6A-6F are cross-sections illustrating an aspect of another embodiment of the method.
Figure 6B:
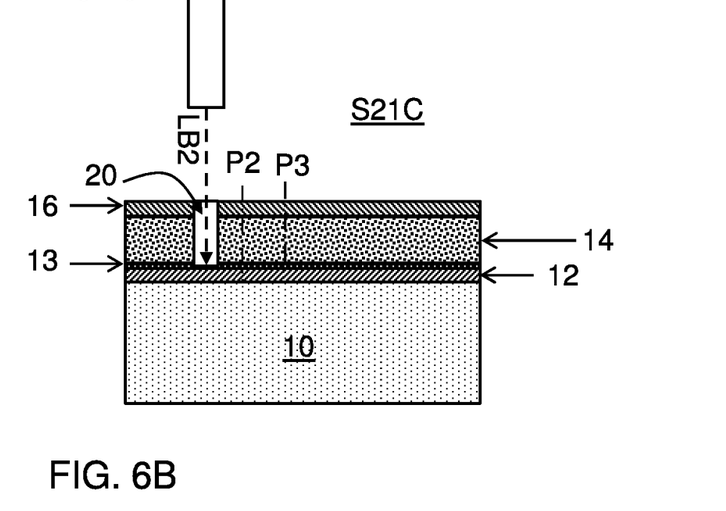
Figure 6C:
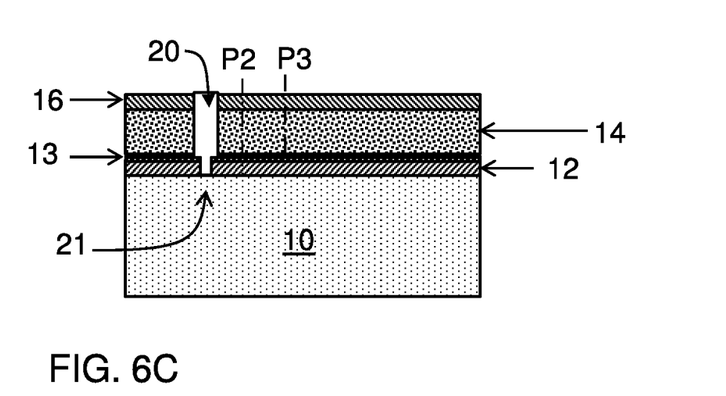
Figure 6D:
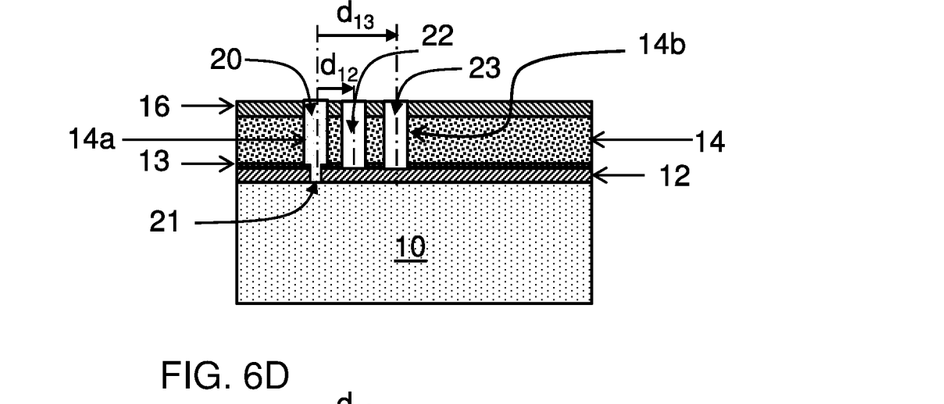
Figure 6E:
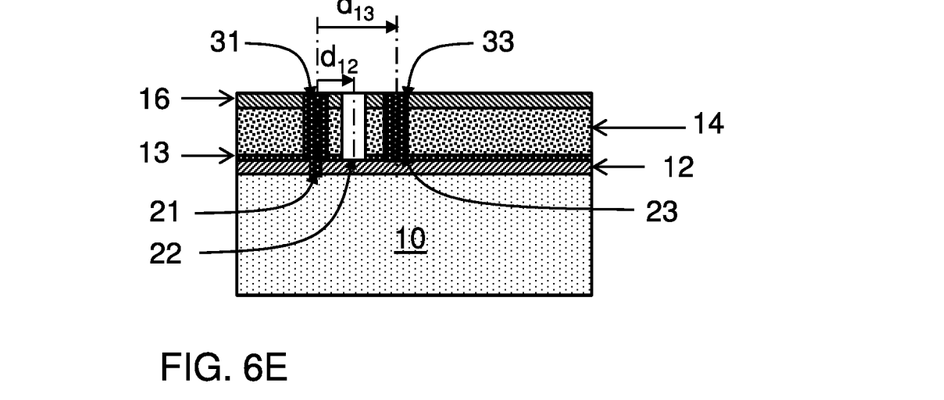
Figure 6F:
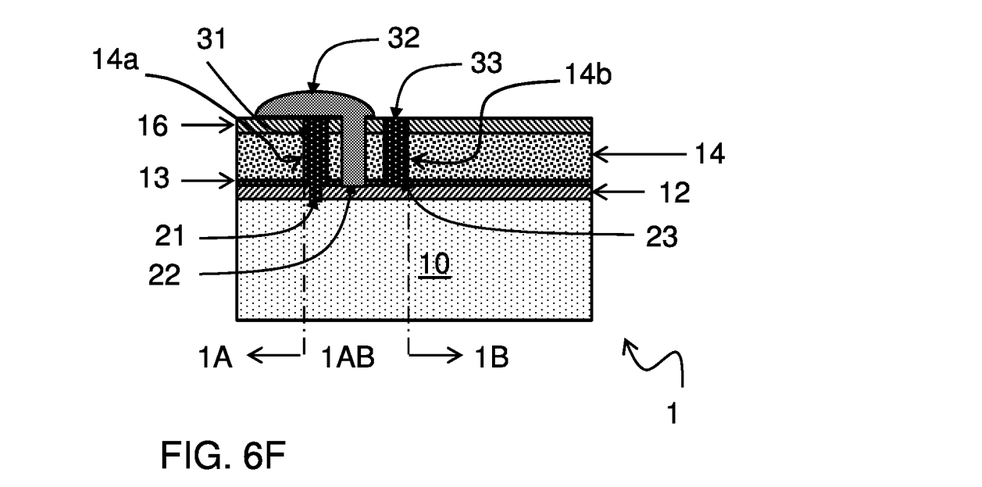

In the embodiment shown in FIG. 6F, the boundary region 1AB is formed with separate P1-, P2- and P3-trenches 21, 22, 23. P1-trench 21 protrudes through each of the top electrode layer 16, the photovoltaic layer 14 and the bottom electrode layer 12 and is filled with an insulating material 31. P3-trench 23 protrudes through each of the top electrode layer 16 and the photovoltaic layer 14 and may also be filled with an insulating material 33, but this is not mandatory. P2-trench 22 protrudes through each of the top electrode layer 16 and the photovoltaic layer 14. An electrically conductive material 32 bridges the P1-trench 21 to electrically interconnect a portion of the top electrode layer 16 of the photovoltaic cell 1A with a portion of the bottom electrode layer 12 of the photovoltaic cell 1B succeeding photovoltaic cell 1A at the bottom of a P2-trench 22. The photovoltaic layer 14 at the side of photovoltaic module 1A has an edge 14a at the P1-trench 21 that is free from re-solidified and phase changed photovoltaic material. Likewise, the photovoltaic layer 14 at the side of photovoltaic module 1B has an edge 14b at the P3-trench 23 that is free from re-solidified and phase changed photovoltaic material. Re-solidified and/or phase changed photovoltaic material would otherwise be present in case these trenches 21, 23 were formed by irradiation at higher energy levels, aiming at a direct removal of the photovoltaic material. Likewise, this may apply for the edges of trench 22, but this is not mandatory, as an electrical connection is formed anyway in this trench. In embodiments, the bottom electrode layer 12 at the bottom of the trenches 22, 23 and the remaining portions of the trench 21 are free from scratches as use of a needle can be avoided.

A method of manufacturing a photovoltaic product 1 as shown in FIG. 1 and FIG. 5E or FIG. 6F may comprise depositing a photovoltaic layer stack, partitioning the stack into photovoltaic modules and serially interconnecting the photovoltaic modules. As the steps may be implemented for example in a roll-to-roll method wherein a foil, e.g. a PET- or PEN foil, serving as a substrate 10 is guided along various manufacturing facilities. The manufacturing facilities may be provided in a single production plant but may alternatively be provided at mutually different production locations. In another embodiment the various operations of the method are provided batch wise. In that case also a rigid material, such as glass may be used as the substrate. The method may for example use a series of manufacturing facilities.

A first manufacturing facility deposits a stack with a bottom electrode layer 12, a top electrode layer 16 and a photovoltaic layer 14 arranged between said first and said top electrode layer, the bottom electrode layer 12 and the photovoltaic layer 14 have an interface layer 13. The interface layer 13 may be provided in an additional deposition step succeeding deposition of the bottom electrode layer 12, and preceding deposition of the photovoltaic layer 14. Alternatively, an interface layer may be formed as a result of a chemical interaction between material of the bottom electrode layer 12 and material of the photovoltaic layer 14. For example an interface layer of $MoSe_2$ may be formed by a chemical reaction at the boundary of a Mo electrode layer and a CIGS photovoltaic layer.

A second manufacturing facility partitions the photovoltaic layer stack into photovoltaic cells 1A, 1B, etc. As a result of partitioning a boundary region 1AB is formed between each photovoltaic cell 1A and a subsequent photovoltaic cell 1B. A third manufacturing facility serially interconnects mutually subsequent photovoltaic cells 1A. 1B in their boundary region 1AB.

Figure 2:
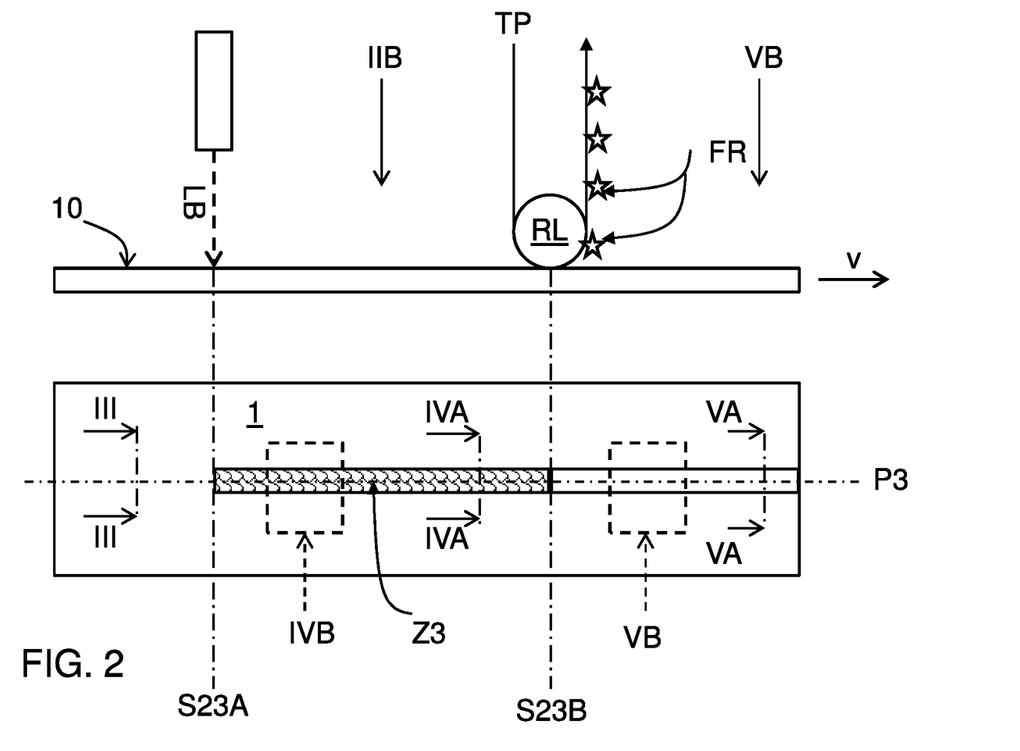
FIG. 2 schematically shows a stage in the manufacturing process according to the present invention. Therein the upper portion of FIG. 2 shows a side view and the lower portion of FIG. 2 shows a top-view according to IIB in the upper portion.
Figure 3:
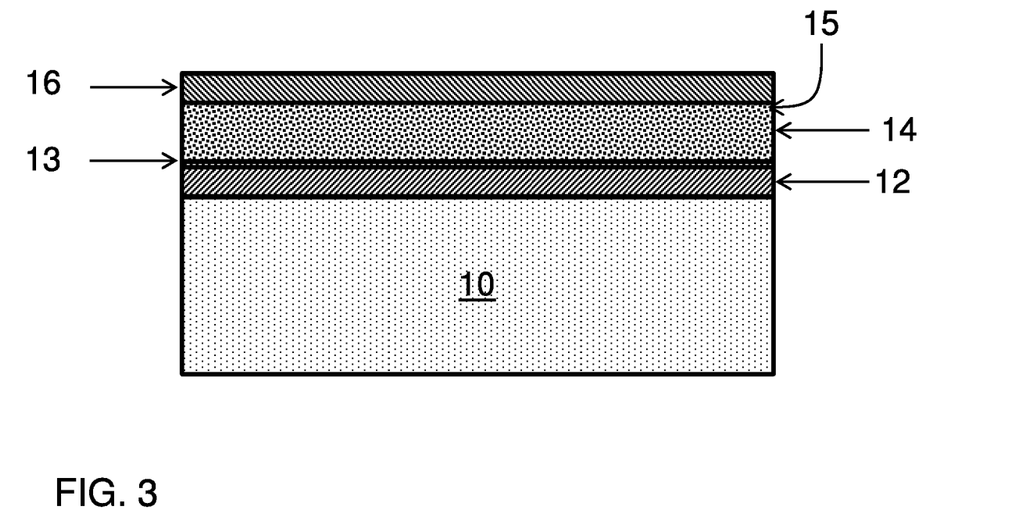
FIG. 3 shows a cross-section according to III-III in FIG. 2.

Partitioning involves forming of a trench through the top electrode layer 16 and the photovoltaic layer 14 in a hybrid procedure comprising at least an irradiation sub-step and subsequent thereto a mechanical fragment removal sub-step as is described in more detail below. FIG. 2 schematically shows a side-view of a manufacturing unit which is part of the manufacturing facility in a roll-to-roll manufacturing process. This part serves to form a trench 20 through the top electrode layer 16 and the photovoltaic layer 14 in a hybrid procedure as referred to above. It is presumed that this manufacturing unit receives a substrate 10, e.g. a PET or PEN foil which is already provided with a photovoltaic layer stack. A top view of the substrate 10 with the stack of layers and the effect of various manufacturing steps is shown in the lower portion of FIG. 2. FIG. 3 is a cross-section of the semi-finished product according to III-III in FIG. 2 and shows the semi-finished product in the state wherein it is received by this manufacturing stage. As shown in FIG. 3, the received semi-finished product comprises a bottom electrode layer 12, a top electrode layer 16 and a photovoltaic layer 14 arranged between said first and said top electrode layer. Furthermore an interface layer 13 as referred to above, is present between the bottom electrode layer 12 and the photovoltaic layer 14. Also an interface layer 15 may be present between the photovoltaic layer 14 and the top electrode layer 16.

Figure 4A:
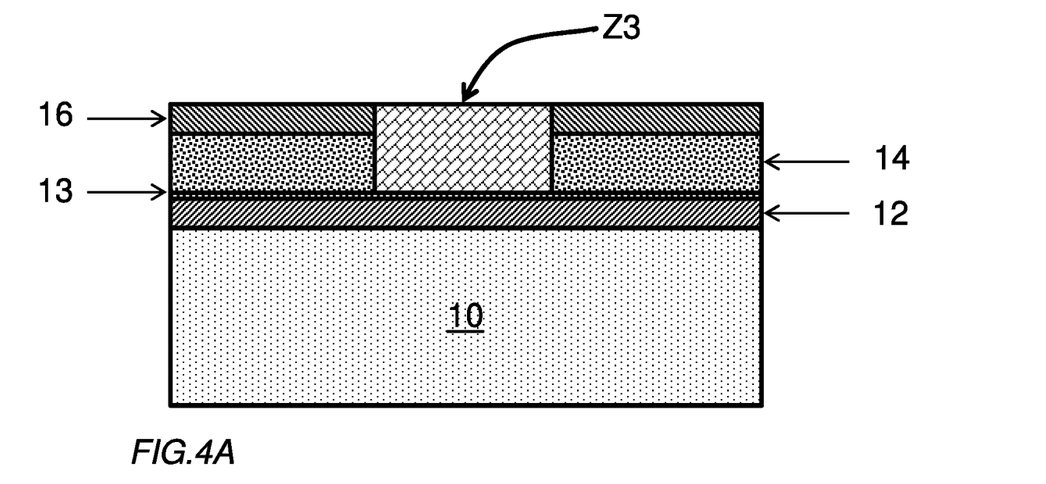
FIG. 4A is a cross-section according to IVA-IVA in FIG. 2.

In this stage of the manufacturing process a trench is formed through, the top electrode layer 16 and the photovoltaic layer 14. As schematically illustrated in FIG. 2, this stage comprises an irradiation sub-step S23A followed by a mechanical fragment removal sub-step S23B. In the irradiation sub-step S23A the semi-finished product is irradiated from a side facing the top electrode layer 16 with a laser beam LB in an irradiation zone Z3 where the trench 20 is to be formed. The beam LB with which the zone Z3 is irradiated has a wavelength for which the interface 13 between the bottom electrode layer 12 and the photovoltaic layer 14 has a relatively high absorption as compared to the photovoltaic layer 14 and the top electrode layer 16. As a result of absorption of the radiation, the interface 13 is heated and causes a local thermally and/or pressure induced stress in the photovoltaic layer 14 and the top electrode layer 16 present thereon. A modest absorption of radiation in the photovoltaic layer and top electrode layer, e.g. absorption of radiation having a wavelength of 1550 nm in a CIGS type photovoltaic layer, may contribute to its fragmentation without causing a phase change. The thermally and/or pressure induced stress causes these layers to locally crack into fragments within the zone Z3, as shown schematically in FIG. 4A, which is a cross-section according to IVA-IVA in FIG. 2. Also a (partial) evaporation of the interface layer 13 may contribute in pressure induction.

The layer fragments FR resulting from the irradiation sub-step remain at the substrate 10 but are easily detachable therefrom. Actual removal takes place in a subsequent mechanical fragment removal sub-step S23B. In this embodiment a sticky tape TP is guided by a roller RL along the surface of the semi-finished product and carries the fragment away. FIG. 5A is a cross-section according to VA-VA in FIG. 2, that schematically shows the semi-finished product after this stage. Additionally or alternatively other methods may be applied for mechanical fragment removal, such as tacky rollers, air flow, carbon dioxide snow and the like.

Samples were prepared on a substrate 10 provided with a bottom electrode layer 12 of Mo with a thickness of 400 nm, a copper indium gallium selenide photovoltaic layer 14 having a thickness of 1600 nm and a top electrode layer comprising i-ZnO/AZO TCO 16 having a thickness of 400 nm. The irradiation sub-step was performed by irradiating the samples with a pulsed laser beam from an Erbium laser having a power of 0.3 W, a wavelength of 1550 nm and a spotsize of 50 micron. The repetition rate was 10 kHz and the pulse duration 2 ns. The beam was translated along a partitioning line at a speed of 250 mm/s.

Figure 4B:
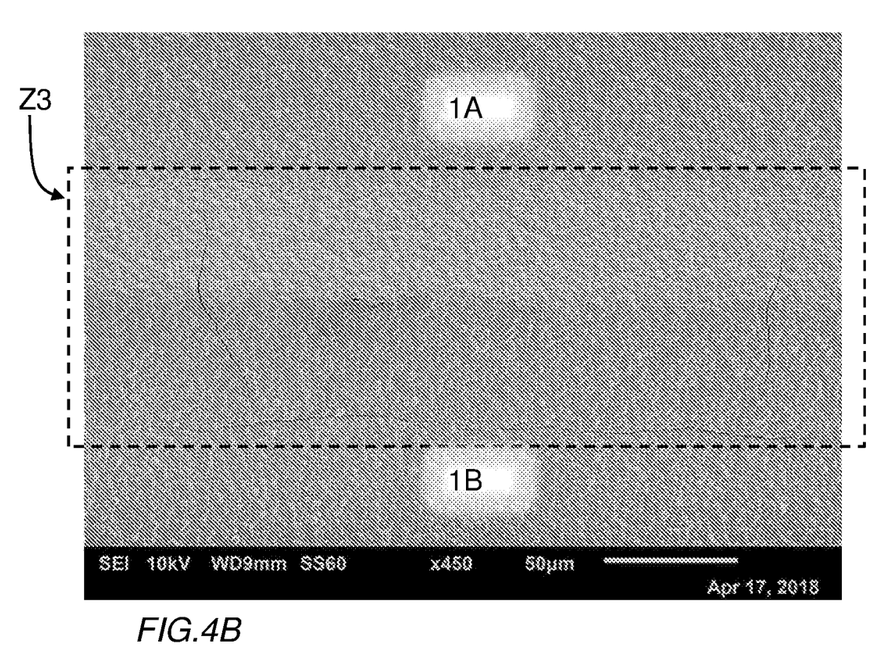
FIG. 4B is a picture of a sample which is taken according to a top-view as indicated by IVB in FIG. 2

FIG. 4B is a picture of a sample after the irradiation sub-step, which is taken according to a top-view as indicated by IVB in FIG. 2. It can be seen in FIG. 4B, that the material of the layers 14, 16 is fragmented in the area Z3 traversed by the laser beam LB, but that the fragmented material is still located at the surface of the sample close to its original location.

As the subsequent mechanical fragment removal sub-step, the sample was cleaned, here, using a sticky tape, which was brought into contact with the surface of the sample and subsequently removed. FIG. 5B, which is a picture of the sample according to view VB in FIG. 2 clearly shows that the layers 14, 16 are partitioned in sections, each at a respective side of trench 20, each associated with a respective photovoltaic cell 1A, 1B to be formed. The variations in width of the trench 20 are relatively small in comparison to the average width of the trench 20. It was confirmed that neither re-solidified material nor phase changed photovoltaic material was present at the edges 14a, 14b of the photovoltaic layer 14 with the trench 20 of the sample so obtained. Sparsely distributed remnants of photovoltaic material are present at the bottom electrode layer 12 at the bottom of the trench 20 of this sample. It was confirmed however that the exposed bottom electrode layer 12 is free from scratches.

FIG. 5C-5E show further process steps that may be applied to the semi-finished product of FIG. 5A.

In FIG. 5C, it is shown how the trench 20 is provided with a deepened portion 21. The deepened portion 21 extends at distance from the edges of the trench 20, in its length direction and therewith partitions the bottom electrode layer 12 into mutually insulated parts at each side of the deepened portion 21. Various methods are suitable to form this deepened portion 21, e.g. mechanical removal of the material of the bottom electrode layer 12 with a needle, laser ablation and the like. Due to the fact that the deepened portion 21 is formed at distance from the edges 14a and 14b of the trench 20 it can be avoided that therewith the photovoltaic material at these edges is heated to the extent that it melts or that a phase change occurs.

In FIG. 5D it is shown, how an insulating material 31, 32, typically, but not necessarily the same insulating material, is deposited at both sides of the single trench 20. Therewith the material 31 protrudes into the deepened portion 21 of the trench 20 and a strip 12ab of the bottom electrode layer 12 remains exposed between the deposited insulating material 31, 32.

In FIG. 5E it is shown how an electrical connection 32 is provided by deposition of an electrically conductive material. The electrical connection 32 formed therewith extends from an end portion of the top electrode layer 16 of the photovoltaic cell 1A to the exposed strip 12ab of the bottom electrode layer 12 of the succeeding photovoltaic cell 1B.

FIG. 6A-6F show another example, wherein the herein disclosed hybrid procedure is applied as part of a series of further processing steps to form a plurality of serially interconnected photovoltaic modules.

Therein FIG. 6A shows a semi-finished product comprising a bottom electrode layer 12, a top electrode layer 16 and a photovoltaic layer 14 arranged between the first and said top electrode layer. The bottom electrode layer 12 and the photovoltaic layer 14 have an interface layer 13.

The semi-finished product in FIG. 6A was provided with a P1-trench 20 using the above-mentioned hybrid procedure. The trench 20 was further provided with a deepened portion 21 to partition the bottom electrode layer 12 for example with an irradiation step S21C using a pulsed laser LB2. Due to the fact that the hybrid procedure was used to form the trench 20, and the fact that the deepened portion 21 is narrower than the trench 20, too high temperatures of the photovoltaic material 14a near the wall of the trench 20 can be avoided, therewith avoiding that it rendered conductive.

Also a P3-trench 23 at a distance $d_{13}$ from the P1-trench 20, 21 was provided using the above-mentioned hybrid procedure. By using this hybrid procedure it was also avoided that photovoltaic material 14b near the wall of the trench 23 was rendered conductive.

Furthermore a P2-trench 22 was provided with the herein disclosed hybrid procedure, at a distance $d_{12}$ from the P1-trench 20, 21, between the P1-trench and the P3-trench. It is advantageous to also use the hybrid procedure to form the P2-trench, so that only a single set of process parameters (except for the additional step to form deepened portion 21 in trench 20) needs to be set for all trenches. However, the P2-trench 22 may also be formed in other ways as it is not a problem when the photovoltaic material near the P2-trench is rendered conductive. This is because the P2-trench serves as the passage for an electrical connection between the photovoltaic modules to be formed.

FIG. 6D shows a further stage, wherein the P1-trench 20, 21 and the P3-trench 23 are filled with an insulating material 31, 33 respectively. Although this is not strictly necessary, the filling 31, 33 makes it easier to avoid shortcuts in later manufacturing stages, for example the further stage shown in FIG. 6C.

In this further stage, in the boundary region 1AB, an electrical connection 32 is formed between a portion of the top electrode layer 16 of the first photovoltaic cell 1A and a portion of the bottom electrode layer 12 of the second photovoltaic cell 1B in P2-trench 22.

The invention claimed is:

1. A method of manufacturing a photovoltaic product having a plurality of serially interconnected photovoltaic cells, the method comprising:
    depositing a stack including:
        a bottom electrode layer,
        a top electrode layer,
        a photovoltaic layer arranged between the bottom electrode layer and the top electrode layer, and
        an interface layer interfacing the bottom electrode layer and the photovoltaic layer;
    partitioning the stack into respective lateral portions associated with respective photovoltaic cells, wherein a plurality of boundary regions are provided such that ones of the boundary regions are provided between each photovoltaic cell and a subsequent photovoltaic cell of the plurality of serially interconnected photovoltaic cells; and
    serially interconnecting, at ones of the plurality of boundary regions, mutually subsequent photovoltaic cells of the plurality of serially interconnected photovoltaic cells;
    wherein the partitioning includes forming one or more trenches extending through the top electrode layer and the photovoltaic layer to expose the bottom electrode layer, with the forming one or more trenches comprising:
        an irradiation sub-step, and
        a mechanical fragment removal sub-step subsequent to the irradiation sub-step,
    wherein, during the irradiation sub-step, an irradiation zone along a partitioning line is irradiated, from a side facing the top electrode layer, by a laser beam having a wavelength for which the interface layer has a relatively higher absorption as compared to absorption of the wavelength by the photovoltaic layer and the top electrode layer,
    wherein, during the irradiation sub-step, irradiation causes material of the interface layer to vaporize causing a vapor pressure that induces a mechanical stress in the photovoltaic layer and the top electrode layer, the mechanical stress causing fragmentation of the photovoltaic layer and the top electrode layer within the irradiation zone, the irradiation being performed such that edges of the photovoltaic layer at the one or more trenches to be formed are free from re-solidified and phase-changed photovoltaic material, and
    wherein the mechanical fragment removal sub-step removes, fragments of the photovoltaic layer and the top electrode layer formed in the irradiation sub-step.

2. The method of claim 1, wherein the mechanical fragment removal sub-step comprises removing the fragments using at least one mechanical removal mode taken from the group consisting of: air flow, carbon dioxide snow, tape, tacky rollers, and brushes with a liquid or gaseous medium.

3. The method of claim 1, wherein the bottom electrode layer is formed of molybdenum.

4. The method according to claim 1, wherein the photovoltaic layer includes one or more layers of copper indium (di)selenide, and/or copper indium gallium (di)selenide.

5. The method according to claim 1, wherein the photovoltaic layer includes one or more layers of a perovskite photovoltaic material.

6. The method according to claim 1, wherein the one or more trenches includes a P1-trench, and wherein the mechanical fragment removal sub-step is succeeded by an additional irradiation sub-step using a laser beam with a wavelength for which the bottom electrode layer has a relatively higher absorption as compared to that of a substrate carrying the bottom electrode layer to form a deepened P1-trench protruding through the bottom electrode layer.

7. The method according to claim 6, comprising subsequently depositing electrically insulating material in the deepened P1-trench.

8. The method according to claim 1, comprising serially interconnecting a pair of mutually subsequent photovoltaic cells by filling at least a P2-trench of the one or more trenches with an electrically conductive material that electrically interconnects a portion of the top electrode layer of a first photovoltaic cell of the pair with a portion of the bottom electrode layer of a second photovoltaic cell of the pair.

9. The method according to claim 1, comprising subsequently filling a P3-trench of the one or more trenches with an insulating material.

10. The method according to claim 6, comprising serially interconnecting a pair of mutually subsequent photovoltaic cells by filling at least a P2-trench of the one or more trenches with an electrically conductive material that electrically interconnects a portion of the top electrode layer of a first photovoltaic cell of the pair with a portion of the bottom electrode layer of a second photovoltaic cell of the pair.

11. The method according to claim 7, comprising serially interconnecting a pair of mutually subsequent photovoltaic cells by filling at least a P2-trench of the one or more trenches with an electrically conductive material that electrically interconnects a portion of the top electrode layer of a first photovoltaic cell of the pair with a portion of the bottom electrode layer of a second photovoltaic cell of the pair.

12. The method according to claim 6, comprising subsequently filling a P3-trench of the one or more trenches with an insulating material.

13. The method according to claim 7, comprising subsequently filling a P3-trench of the one or more trenches with an insulating material.

14. The method according to claim 10, comprising subsequently filling a P3-trench of the one or more trenches with an insulating material.

15. The method according to claim 11, comprising subsequently filling a P3-trench of the one or more trenches with an insulating material.

16. The method according to claim 6, wherein the photovoltaic layer includes one or more layers of copper indium (di)selenide, and/or copper indium gallium (di)selenide.

17. The method according to claim 7, wherein the photovoltaic layer includes one or more layers of copper indium (di)selenide, and/or copper indium gallium (di)selenide.

18. The method according to claim 6, wherein the photovoltaic layer includes one or more layers of a perovskite photovoltaic material.

19. The method according to claim 7, wherein the photovoltaic layer includes one or more layers of a perovskite photovoltaic material.

20. The method according to claim 10, wherein the photovoltaic layer includes one or more layers of a perovskite photovoltaic material.

* * * * *